US008847193B2

(12) United States Patent
Daley et al.

(10) Patent No.: US 8,847,193 B2
(45) Date of Patent: Sep. 30, 2014

(54) PHASE CHANGE CURRENT DENSITY CONTROL STRUCTURE

(71) Applicants: Jon Daley, Boise, ID (US); Kristy A. Campbell, Boise, ID (US)

(72) Inventors: Jon Daley, Boise, ID (US); Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/033,913

(22) Filed: Sep. 23, 2013

(65) Prior Publication Data
US 2014/0021435 A1 Jan. 23, 2014

Related U.S. Application Data

(60) Division of application No. 13/569,779, filed on Aug. 8, 2012, now Pat. No. 8,546,784, which is a continuation of application No. 13/088,775, filed on Apr. 18, 2011, which is a division of application No. 11/304,593, filed on Dec. 16, 2005, now Pat. No. 7,943,921.

(51) Int. Cl.
H01L 47/00 (2006.01)
H01L 45/00 (2006.01)

(52) U.S. Cl.
CPC ............ *H01L 45/06* (2013.01); *H01L 45/1666* (2013.01); *H01L 45/144* (2013.01); *H01L 45/1246* (2013.01); *H01L 45/1233* (2013.01)
USPC ............................................................ 257/4

(58) Field of Classification Search
USPC .......... 257/2–4, E31.029; 365/145, 151, 153, 365/163
See application file for complete search history.

(56) References Cited

U.S. PATENT DOCUMENTS

| 4,115,872 A | 9/1978 | Bluhm |
| 4,599,705 A | 7/1986 | Holmberg et al. |
| 4,809,044 A | 2/1989 | Pryor et al. |
| 5,177,567 A | 1/1993 | Kiersy et al. |
| 5,363,329 A | 11/1994 | Troyan |
| 5,789,758 A | 8/1998 | Reinberg |
| 5,825,046 A | 10/1998 | Czubatyj et al. |

(Continued)

FOREIGN PATENT DOCUMENTS

| EP | 0 269 225 A2 | 6/1988 |
| EP | 1 724 850 A2 | 11/2006 |
| KP | 2000-0052840 A | 8/2006 |
| WO | WO-2006/110518 A2 | 10/2006 |

OTHER PUBLICATIONS

Annex to Form PCT/ISA/206, "Communication Relating to the Results of the Partial International Search," May 22, 2007.

(Continued)

*Primary Examiner* — Brook Kebede
(74) *Attorney, Agent, or Firm* — Dickstein Shapiro LLP

(57) ABSTRACT

A phase change memory element and method of forming the same. The memory element includes first and second electrodes. A first layer of phase change material is between the first and second electrodes. A second layer including a metal-chalcogenide material is also between the first and second electrodes and is one of a phase change material and a conductive material. An insulating layer is between the first and second layers. There is at least one opening in the insulating layer providing contact between the first and second layers.

12 Claims, 5 Drawing Sheets

(56) References Cited

U.S. PATENT DOCUMENTS

| | | | |
|---|---|---|---|
| 5,920,788 A * | 7/1999 | Reinberg | 438/466 |
| 6,087,674 A | 7/2000 | Ovshinsky et al. | |
| 6,656,241 B1 * | 12/2003 | Hellring et al. | 51/308 |
| 2003/0155589 A1 * | 8/2003 | Campbell et al. | 257/225 |
| 2004/0245517 A1 | 12/2004 | Campbell | |
| 2006/0226409 A1 | 10/2006 | Burr et al. | |
| 2006/0266993 A1 | 11/2006 | Suh et al. | |
| 2007/0158631 A1 | 7/2007 | Daley et al. | |

OTHER PUBLICATIONS

Hudgens et al., "Overview of Phase-Change Chalcogenide Novolatile Memory Technology," *MRS Bulletin*, Nov. 2004, pp. 829-832.

Hwang et al., "Full Integration and Reliability Evaluation of Phase-Change RAM Based on 0.24 um-CMOS Technologies," 2003 *Symposium on VLSL Technology Digest of Technical Papers*, pp. 173-174.

Lai et al, OUM—A 180 nm Nonvolatile Memory Clel Element Technology for Stand Alone and Embedded Applications, IEDM 01-803, *2001 IEEE*, pp. 36-5.1-36.5.4.

Lankhorst et al., "Low-Cost and Nanoscale Non-Volatile Memory Concept for Future Silicon Chips," *Nature Materials*, vol. 4, p. 347-352 (Apr. 2005).

Lee et al., Full Integration and Cell Characteristics for 64 Mb Non-volatile PRAM, 2004 Symposium on VLSI Technology Digest of Technical Papers, *2004 IEEE*, ppg. 20-21.

Liang, M-C. et al., "Dielectric Resolution Enhancement Coating Technology (DiRECT)-A Sub90 nm Space and Hole Patterning Technology Using 248-nm Lithography and Plasma-Enhanced Polymerization," *IEEE Electron Device Letters*, Sep. 2003, pp. 562-564, vol. 24, No. 9.

Wyttug, "Phase Change Materials Towards a Universal Memory?" *Nature Materials*, vol. 4, pp. 265-266 (Apr. 2005).

\* cited by examiner

PHASE CHANGE CURRENT DENSITY CONTROL STRUCTURE

CROSS-REFERENCE TO RELATED APPLICATION

This application is a divisional application of U.S. patent application Ser. No. 13/569,779, filed Aug. 8, 2012, which will issue as U.S. Pat. No. 8,546,784 on Oct. 1, 2013, which is a continuation application of Ser. No. 13/088,776, filed Apr. 18, 2011, now U.S. Pat. No. 8,252,622, issued Aug. 28, 2012, which is a divisional application of U.S. patent application Ser. No. 11/304,593, filed Dec. 16, 2005, now U.S. Pat. No. 7,943,921, issued May 17, 2011, each of which is incorporated in its entirety by reference herein.

FIELD OF THE INVENTION

The present invention relates to semiconductor devices, and in particular phase-change memory devices and methods of forming the same.

BACKGROUND OF THE INVENTION

Non-volatile memories are important elements of integrated circuits due to their ability to maintain data absent a power supply. Phase change materials have been investigated for use in non-volatile memory cells. Phase change memory cells include phase change materials, such as chalcogenide alloys, which are capable of stably transitioning between amorphous and crystalline phases. Each phase exhibits a particular resistance state and the resistance states distinguish the logic values of the memory cell. Specifically, an amorphous state exhibits a relatively high resistance, and a crystalline state exhibits a relatively low resistance.

A typical phase change cell has a layer of phase change material between first and second electrodes. As an example, the phase change material is a chalcogenide alloy, such as $Ge_2Sb_2Te_5$ or SbTeAg. See, e.g., Lankhorst et al., *Low-cost and nanoscale non-volatile memory concept for future silicon chips*, NATURE MATERIALS, vol. 4 pp. 347-352 (April 2005).

A portion of the phase change material is set to a particular resistance state according to the amount of current applied via the electrodes. To obtain an amorphous state, a relatively high write current pulse (a reset pulse) is applied through the phase change cell to melt a portion of the material for a short period of time. The current is removed and the cell cools rapidly to a temperature below the glass transition temperature, which results in the portion of the material having an amorphous phase. To obtain a crystalline state, a lower current write pulse (a set pulse) is applied to the phase change cell for a longer period of time to heat the material to a temperature below its melting point. This causes the amorphous portion of the material to re-crystallize to a crystalline phase that is maintained once the current is removed and the cell is rapidly cooled.

A sought after characteristic of non-volatile memory is low power consumption. Often, however, phase change memory cells require large operating currents. It is therefore desirable to provide a phase change memory cell with reduced current requirements. For phase change memory cells, it is necessary to have a current density that will heat the phase change material past its melting point and quench it in an amorphous state. One way to increase current density is to decrease the size of a bottom electrode; another way is to deposit small conductive crystals on the bottom electrode. These methods maximize the current density at the bottom electrode interface to the phase change material.

It would be desirable, however, to maximize the current density at a location above the bottom electrode in certain applications.

BRIEF SUMMARY OF THE INVENTION

Embodiments of the invention provide phase change memory elements and methods of forming the same. An exemplary memory element includes first and second electrodes. A first layer of phase change material is located between the first and second electrodes. A second layer comprising a metal chalcogenide material is also between the first and second electrodes and is one of a phase change material and a conductive material. An insulating layer is between the first and second layers. There is at least one opening in the insulating layer providing contact between the first and second layers.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

Figure 1:
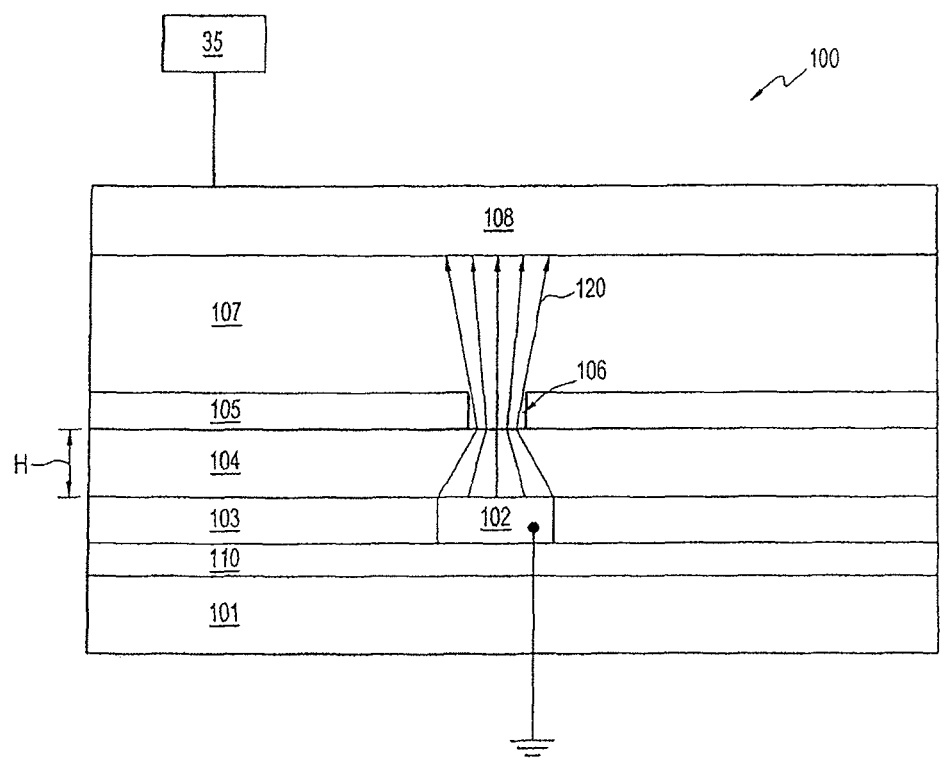
FIG. 1 depicts a phase change memory element according to an exemplary embodiment of the invention.

The invention is now explained with reference to the figures, which illustrate exemplary embodiments and throughout which like reference numbers indicate like features. FIG. 1 depicts an exemplary embodiment of a phase change memory element 100 constructed in accordance with the invention. The element 100 shown in FIG. 1 is supported over a substrate 101. Over the substrate 101 is a first insulating layer 110.

A first electrode 102 and second insulating layer 103 are over the first insulating layer 110 and substrate 100. The first electrode 102 can be any suitable conductive material, such as platinum or tungsten, among others. The second insulating layer 103 can be a nitride, such as silicon nitride (Si3N4); a low dielectric constant material; an insulating glass; or an insulating polymer; among other materials.

As shown in FIG. 1, a first layer 104 of phase change material, preferably a chalcogenide material, is over the first electrode 102 and the second insulating layer 103. The first layer 104 is electrically coupled to the first electrode 102 through an opening in the second insulating layer 103. In the illustrated embodiment, the first layer 104 is a germanium-telluride layer. Other exemplary chalcogenide compositions for the first layer 104 include concentrations of Te below about 70%. The germanium concentration is preferably above about 10%. The first layer 104 can include additional elements, for example antimony. The percentages given are atomic percentages which total 100% of the atoms of the constituent elements. In the illustrated embodiment, the first layer 104 is about 300 Å to about 500 Å thick and is in electrical contact with the underlying first electrode 102.

A third insulating layer 105 is over the first layer 104. In the illustrated embodiment, the second insulating layer 103 is amorphous carbon, but other insulating materials can be used. An opening 106 extends through the third insulating layer 105 over the phase change material of the first layer 104. The opening 106 is at a location such that it is at least partially directly above the first electrode 102. The opening 106 has an area smaller than the surface area of the first electrode 102. Optionally, there can be more than one opening 106 within the insulating layer 105.

Over the third insulating layer 105 and within the opening 106 is a second layer 107 of metal-chalcogenide material. Alternatively, the second layer could be a phase change material, and further can be the same material as the first layer 104. In the illustrated embodiment, the second layer 107 is, for example, a tin-telluride layer having about 50% tin and about 50% tellurium and is about 500 Å to about 700 Å thick.

Although second layer 107 is shown over the chalcogenide material of the first layer 104, it should be understood that the orientation of the layers can be altered. For example, the first layer 104 may be over the second layer 107 and within the opening 106.

Over the second layer 107 is a second electrode 108. The second electrode 108 can be any suitable conductive material, for example, platinum, among others. Tungsten in the illustrated embodiment.

For operation, a pulse generator 35 is used to apply a reset pulse to the element 100. The pulse generator 35 can be for example, memory access circuitry, such as DRAM memory cell access circuitry, among others. The reset pulse melts at least a portion of one or more of the germanium-telluride first layer 104, the layer 107 or the interface between layers 104 and 107. This leaves the melted portion(s) in a high resistance, amorphous state. A set pulse crystallizes at least a portion of the germanium-telluride first layer 104, leaving the first layer 104 in a low resistance state. During operation, current 120 is channeled through the opening 106 to achieve an increased current density at a distance H from the first electrode 102 and at the interface of the first and second layers 104, 107. In the illustrated embodiment, the distance H is the thickness of the first layer 104. It should be understood that the element 100 can be configured such that H is a different distance from the first electrode 102. The height H is selected to achieve the increased current density at a desired height and will depend on the particular material(s) used in the element 100.

FIGS. 2A-2H are cross sectional views of a wafer fragment depicting the formation of the memory element 100 according to an exemplary embodiment of the invention. No particular order is required for any of the actions described herein, except for those logically requiring the results of prior actions. Accordingly, while the actions below are described as being performed in a specific order, the order is exemplary only and can be altered if desired. Although the formation of a single memory element 100 is shown, it should be appreciated that the memory element 100 can be one memory element in an array of memory elements, which can be formed concurrently.

Figure 2A:
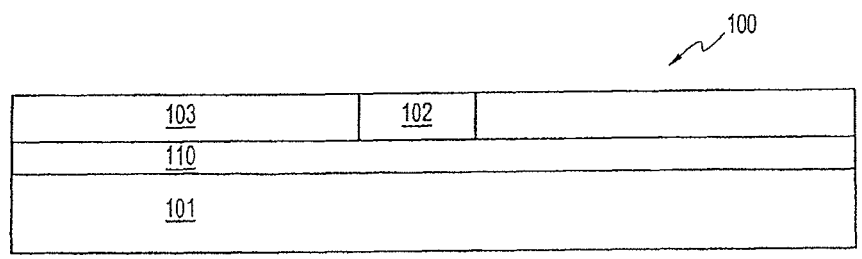
FIGS. 2A-2H depict the formation of the memory element of FIG. 1 at different stages of processing.

As shown by FIG. 2A, a substrate 101 is initially provided. As indicated above, the substrate 101 can be semiconductor-based or another material useful as a supporting structure as is known in the art. A first insulating layer 110 is formed over the substrate 101. A first electrode 102 and second insulating layer 103 are formed over the first insulating layer 110. The first electrode 102 is formed within an opening in the second insulating layer 103 such that the surface of the first electrode 102 is exposed. The first insulating layer 110 can be, for example, silicon dioxide. The second insulating layer 103 can be silicon nitride, a low dielectric constant material, or other suitable insulators known in the art, and may be formed by any method known in the art.

Figure 2B:
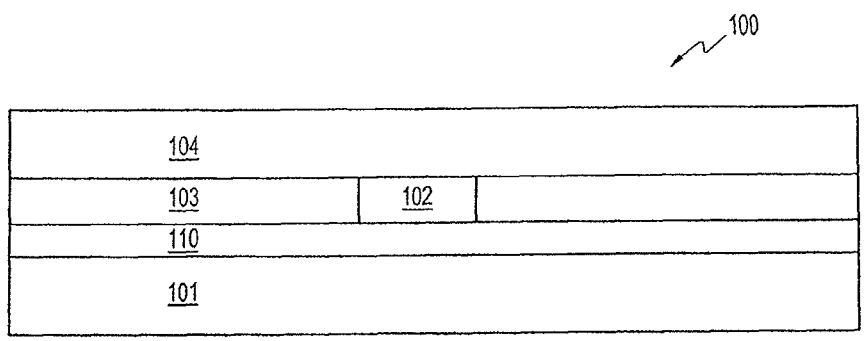

As shown in FIG. 2B, a first layer 104 of phase change material, e.g., germanium-telluride, is formed over the first electrode 102 and second insulating layer 103. Formation of the first layer 104 may be accomplished by any suitable method. In the depicted embodiment, the first layer 104 is formed having a thickness of about 300 Å to about 500 Å.

Figure 2C:
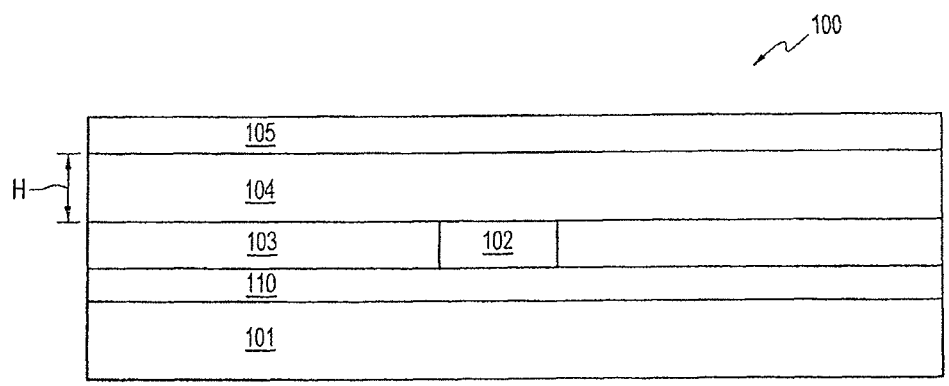

FIG. 2C depicts the formation of the third insulating layer 105. In the illustrated embodiment, the third insulating layer 105 is an amorphous carbon layer, but other materials may be used. The insulating layer 105 is formed at a distance H over the first electrode 102 and can be formed by any suitable technique. In the illustrated embodiment, H is the thickness of the first layer 104. H, however, could be a different distance. Additionally, the third insulating layer 105 could instead be formed over more than one layer.

Figure 2D:
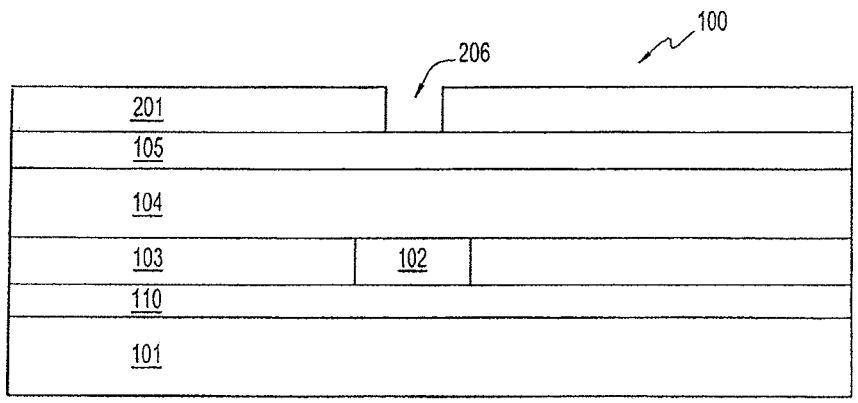

Referring to FIG. 2D, a layer 201 of photoresist is formed over the third insulating layer 105. The photoresist layer 201 is patterned to have an opening 206 to expose the insulating layer 105. The opening 206 is formed at a location such that the opening 206 is formed at least partially directly above the first electrode 102. The size and location of the opening 206 determines the size and location of the opening 106 (FIG. 1) to be formed in the insulating layer 105.

Figure 2E:
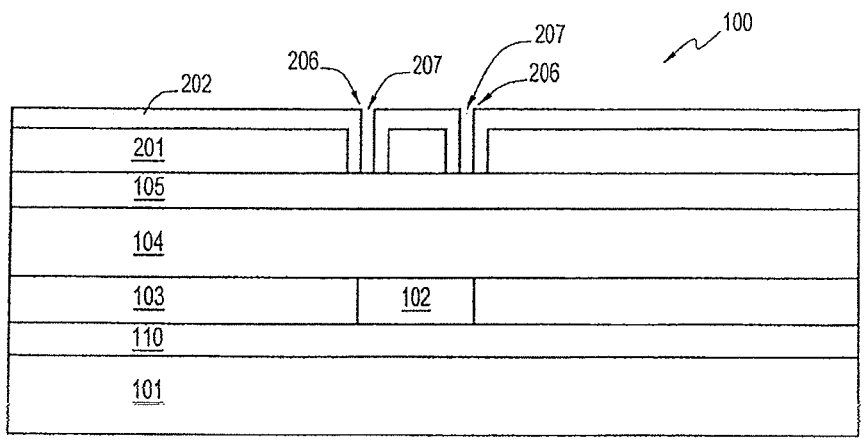

Alternatively, more than one opening 206 can be patterned in the photoresist layer 201 above the first electrode 102, as shown in FIG. 2E. Additionally, an optional process can be used to further reduce the size of the opening 106 (FIG. 1) that will be formed. For this optional process, a second layer of material 202 is formed over the photoresist layer 201 and lining the sidewalls of openings 206. Openings 207 are formed in the pattern created by the photoresist layer 201 and the material 202 together. Thereby the openings 207 have a reduced size as compared to the openings 206. Once the openings 207 are formed the material 202 is removed.

Figure 2F:
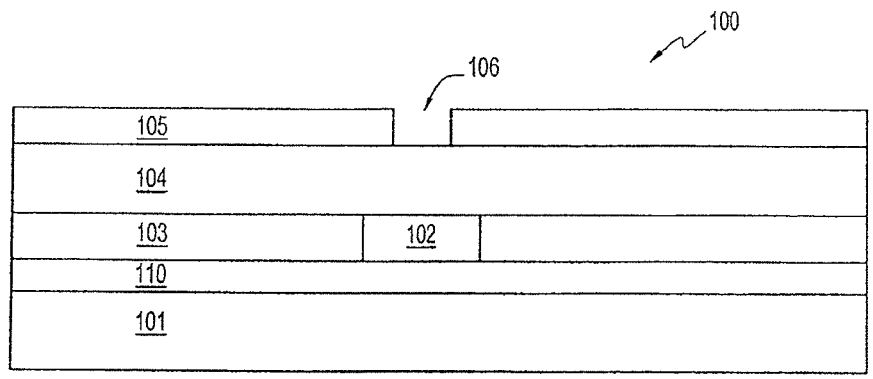

As depicted in FIG. 2F, the portions of the third insulating layer 105 exposed by the opening 206 (or opening 207, in the case of the process described in connection with FIG. 2E) are removed to form opening(s) 106. The photoresist layer 201 (and layer 202) are also removed by conventional methods. Hereinafter, the invention is illustrated as having one opening 106 for exemplary purposes only.

Figure 2G:
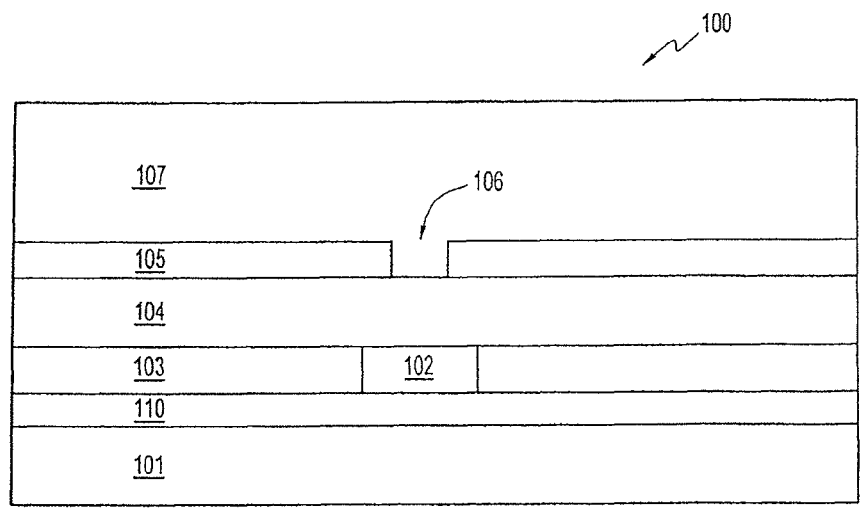

A second layer 107 of a metal-chalcogenide material, e.g., tin-telluride, is formed over the third insulating layer 105 and within the opening 106, as shown in FIG. 2G. The second layer 107 can be formed by any suitable method, e.g., physical vapor deposition, chemical vapor deposition, co-evaporation, sputtering, among other techniques. In the illustrated embodiment, the second layer 107 is formed having a thickness of about 500 Å to about 700 Å.

Figure 2H:
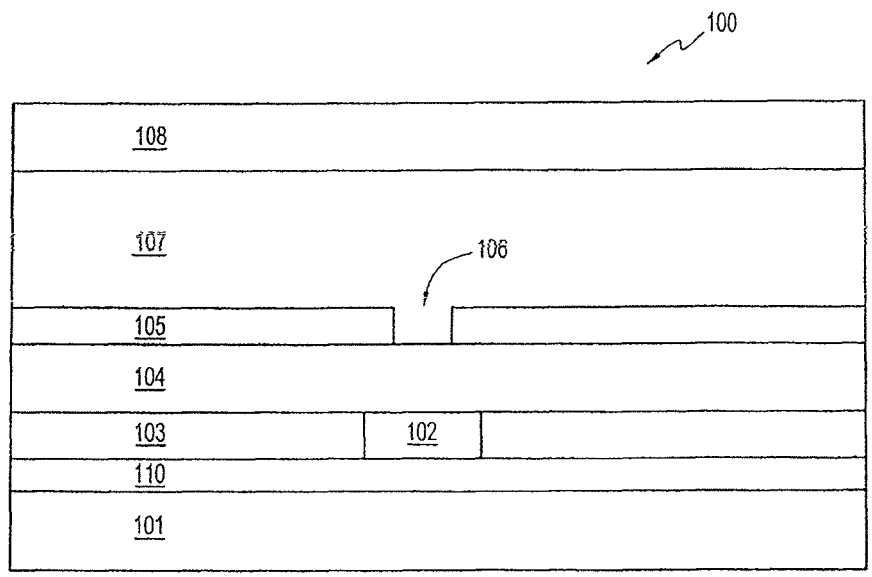

As illustrated in FIG. 2H, a conductive material is deposited over the second layer 107 to form a second electrode 108. Similar to the first electrode 102, the conductive material for the second electrode 108 may be any material suitable for a conductive electrode, for example, platinum or tungsten, among others. In the illustrated embodiment, the layers 104, 105, 107, 108 are formed as blanket layers.

Although the memory element 100 is shown having first and second layers 104, 107, the element 100 can include additional layers of the same or different materials described above between the first and second electrodes 102, 108. Further, the insulating layer 105 can be between any of the additional layers to achieve an increased current density at a desired distance H from the first electrode 102.

Additional processing steps can be performed, for example, to form connections to other circuitry of the integrated circuit (e.g., logic circuitry, sense amplifiers, etc.) of which the memory element 100 is a part, as is known in the art.

Figure 3:
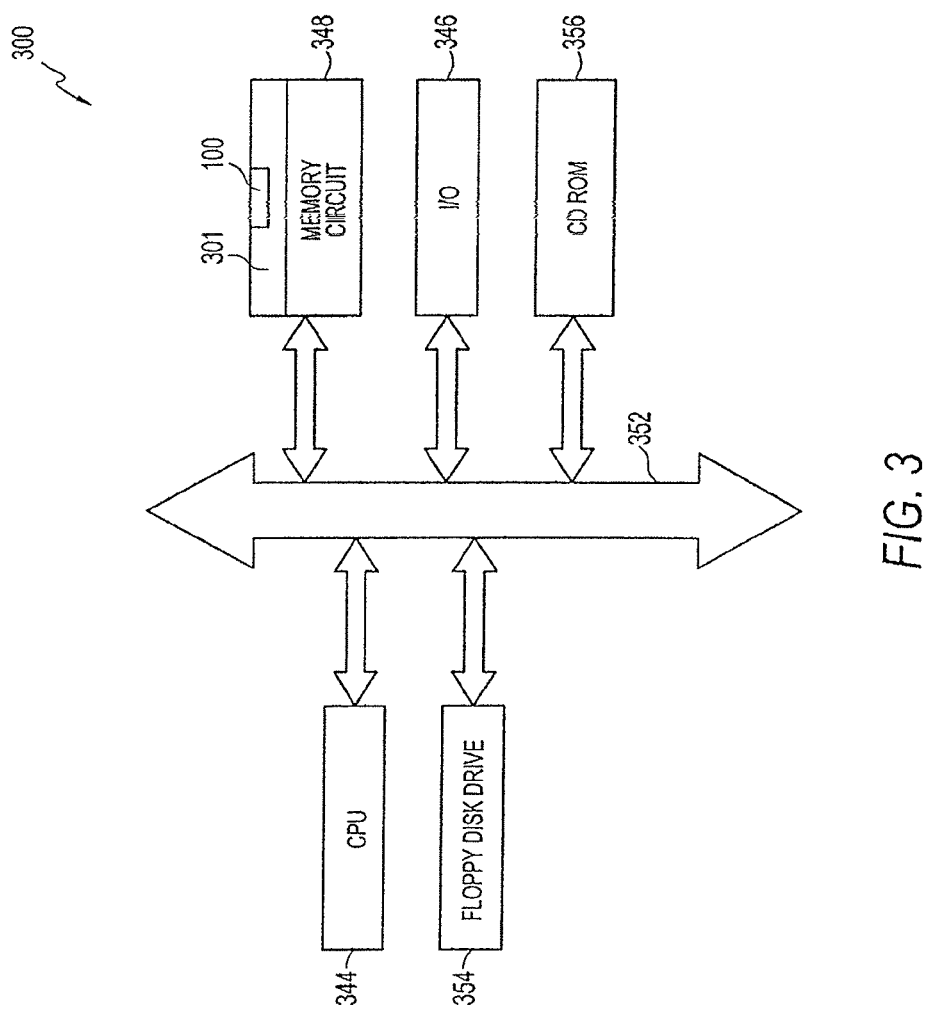
FIG. 3 is a block diagram of a system including a memory element according to an exemplary embodiment of the invention.

FIG. 3 illustrates a processor system 300 which includes a memory circuit 348, e.g., a memory device, which employs memory array 301, which includes at least one memory element 100 constructed according to the invention. The processor system 300, which can be, for example, a computer system, generally comprises a central processing unit (CPU) 344, such as a microprocessor, a digital signal processor, or other programmable digital logic devices, which communicates with an input/output (I/O) device 346 over a bus 352. The memory circuit 348 communicates with the CPU 344 over bus 352 typically through a memory controller.

In the case of a computer system, the processor system 300 may include peripheral devices such as a floppy disk drive 354 and a compact disc (CD) ROM drive 356, which also communicate with CPU 344 over the bus 352. Memory circuit 348 is preferably constructed as an integrated circuit, which includes a memory array 301 having at least one memory element 100 according to the invention. If desired, the memory circuit 348 may be combined with the processor, for example CPU 344, in a single integrated circuit.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A processor system comprising:
   a processor; and
   a memory device coupled to the processor and comprising a memory element, the memory element comprising:
   a first electrode,
   a second electrode;
   a first phase change material between the first and second electrodes,
   a second metal-chalcogenide material between the first and second electrodes, and
   an insulating layer between the first and second materials, at least one opening in the insulating layer providing contact between the first and second materials;
   wherein the at least one opening area is smaller than the surface area of at least one of the first and second electrodes to increase current density during an operation of the memory element.

2. The system of claim 1, wherein the first material comprises a chalcogenide material.

3. The system of claim 2, wherein the first material comprises germanium-telluride.

4. The system of claim 1, wherein the first material has a thickness of about 300 Å to about 500 Å.

5. The system of claim 1, wherein the second material comprises a metal-chalcogenide material.

6. The system of claim 5, wherein the second material comprises tin-telluride.

7. The system of claim 1, wherein the second material has a thickness of about 500 Å to about 700 Å.

8. The system of claim 1, wherein the at least one opening is at least partially directly above the second electrode.

9. The system of claim 1, wherein the insulating layer comprises amorphous carbon.

10. The system of claim 1, wherein at least one of the first and second electrodes comprise tungsten.

11. The system of claim 1, wherein the at least one opening comprises at least two openings.

12. The system of claim 1, wherein the current density is used to change the phase of at least a portion of one or more of the first material, the second material, or an interface between the first and second materials.

* * * * *